United States Patent [19]
Spears

[11] Patent Number: 5,455,421
[45] Date of Patent: Oct. 3, 1995

[54] INFRARED DETECTOR USING A RESONANT OPTICAL CAVITY FOR ENHANCED ABSORPTION

[75] Inventor: David L. Spears, Acton, Mass.

[73] Assignee: Massachusetts Institute of Technology, Cambridge, Mass.

[21] Appl. No.: 765,316

[22] Filed: Aug. 13, 1985

[51] Int. Cl.[6] ............................... G01J 5/20; H01L 27/14
[52] U.S. Cl. ................... 250/338.4; 250/339.01; 257/436
[58] Field of Search ............... 250/338 SE, 339, 250/338.4, 339.01; 357/30; 257/436

[56] References Cited

U.S. PATENT DOCUMENTS

| | | | |
|---|---|---|---|
| 3,444,381 | 5/1969 | Wendland | 250/338 SE |
| 3,487,223 | 12/1969 | St. John | 250/338 SE |
| 4,415,806 | 11/1983 | Tar | 250/339 |

OTHER PUBLICATIONS

J. Muller, IEEE Transactions On Electron Dev., vol. ED-25, No. 2, Feb. 1978, p. 247.
H. Elabd & W. F. Kosonocky, "The Photoresponse of Thin-Film PtSi Shottky Barrier Detector with Optical Cavity," RCA Review, vol. 43, Sep. 1982 at 542.
H. Levinstein et al. "Infrared Detectors in Remote Sensing", Proceedings of the I.E.E.E., vol. 63, No. 1, Jan. 1965 at 6.
W. F. Kosonocky & H. Elabd, "Schottky-Barrier Infrared Charge-Coupled Device Focal Plane Arrays", Proceedings of SPIE, vol. 443, at 167, San Diego, Aug. 1983.
M. A. Novice & J. Vine, "Optical Means for Enhancing the Sensitivity of a Tri-Alkali Photocathode", Applied Optics, vol. 6, No. 7, Jul. 1967.

Primary Examiner—Stephen C. Buczinski
Attorney, Agent, or Firm—Wolf, Greenfield & Sacks

[57] ABSTRACT

A photodetector for detecting optical irradiation at a predetermined wavelength is provided with an integral, resonant optical cavity by forming a plurality of layers of material on a metallic reflector backing, the total optical thickness of those layers being an odd multiple of one-quarter of the predetermined wavelength. One of those layers is an active (i.e. optically-absorptive) semiconductor material. When the materials are deposited, that absorbing layer is formed at a level in the cavity including a region of peak optical field. As a result of the enhanced absorption provided by the resonant structure, the active layer may be very thin (i.e., less than one-tenth of a wavelength thick), yielding many beneficial results.

10 Claims, 3 Drawing Sheets

| EMBODIMENT OF | PHOTOCONDUCTOR OR PHOTODIODE ? | LAYER NO. | EXEMPLARY MATERIAL |
|---|---|---|---|
| FIG. 1 | PHOTOCONDUCTOR | 22 | Ge |
| | | 18 | Ge (n+) |
| | | 14 | Ge:B, WITH A THIN LAYER OF UNDOPED Ge ON TOP |
| | | 16 | Ge (n+) |
| FIG. 1 | PHOTODIODE | 22 | Ge OR GaAs |
| | | 18 | InSb (n+) |
| | | 14 | InSb |
| | | 16 | InSb (p+) |
| FIG. 2 | PHOTOCONDUCTOR | 46 | Te |
| | | 42 | PbSnTe |
| | | 44 | $As_2S_3$ |
| FIG. 2 | LATERAL PHOTODIODE | 46 | $As_2S_3$ |
| | | 42 | InGaAsP (Half n+, Half p+) |
| | | 44 | LiF |

FIG. 4

INFRARED DETECTOR USING A RESONANT OPTICAL CAVITY FOR ENHANCED ABSORPTION

LICENSE TO U.S. GOVERNMENT

The Government of the United States of America has rights in and to this invention pursuant to the following contracts: No. F19628-85-C-0002 (Department of the Air Force) and No. NAS5-28564 (National Aeronautics and Space Administration).

FIELD OF THE INVENTION

This invention relates generally to the field of optical signal detection and, more particularly, to semiconductor-type photodetectors for detecting infrared radiation.

BACKGROUND OF THE INVENTION

The science of detecting infrared and other optical signals by electrical processes is over one hundred fifty years old. It has progressed from the use of radiation thermocouples to thermopiles, to photoconductors (originally of selenium and subsequently of numerous other materials), and photovoltaics. A brief review of the history of infrared detection, in particular, may be found in H. Levinstein et al, "Infrared Detectors in Remote Sensing," *Proceedings of the I.E.E.E.*, Vol. 63, No. 1, January 1965, at 6.

Infrared detectors are used in a wide variety of applications. They are used, for example, to assist energy conservation efforts by sensing heat loss from buildings; to facilitate preventive maintenance of mechanical equipment by detecting localized overheating (e.g., of bearings) before equipment failure occurs; to facilitate diagnosis of certain injuries and diseases by detecting abnormal tissue temperatures; to detect signals transmitted over optical communications channels such as optical fibers; to detect signals of physical and astrophysical interest; and to locate heat sources of various types under a wide variety of conditions, including conditions of poor visibility.

In many of these applications, such detectors must satisfy stringent requirements; these include goals of small size, low power consumption, high sensitivity to incident radiation at the wavelength(s) of interest, fast response and low noise. Of these, high sensitivity and low noise frequently are the dominant requirements. To achieve low noise and high sensitivity, detectors are made as small as possible and are often cooled to within a few tens of degrees Kelvin of absolute zero. The cooling equipment, of course, adds sustantially to space and power consumption; and the cooler the detector must be, the greater the overhead imposed by the cooling equipment.

With detectors in which optical absorption takes place in a semiconductor, sensitivity and performance generally increase with decreasing thickness of the active semiconductor material, provided there is strong absorption of the incident radiation. In the prior art, however, strong absorption has not been attained unless the thickness of the detector is greater than the absorption length of the incident radiation in the semiconductor material; and absorption length is a fundamental physical property of that material, so thickness constraints have been a significant obstacle to improved performance.

The past four decades have seen much progress in the development of high performance infrared detectors and optical detectors for other wavelengths. A great deal of this progress is attributable to improvements in techniques for fabricating the photoconductive and photovoltaic semiconductor materials which are used in such detector elements. Less progress has been made in the area of detector structure. Thus the photodiode family includes just a few types of structures (albeit with variations within each type); these include p-n junction diodes, p-ipn diodes, metal-semiconductor diodes (e.g., Schottky barrier), and heterojunction diodes. In some of these photodiodes, light absorption takes place in a semiconductor material, while in others the absorption occurs in a thin metal film layer; each has its advantages and disadvantages, including wavelengths of superiority, The present invention relates most immediately to the type of photodetector which uses a semiconductor material for absorption of light, but it is also useful with some of the photodetector structures in which light is absorbed in a metal film.

It is therefore an object of the invention to provide an improved photodetector structure.

Another object of the invention is to provide a photodetector structure using an active layer of optically absorptive material whose thickness is substantially less than the absorption length of the active material.

Another object of the invention is to provide a photodetector structure exhibiting increased sensitivity to incident optical radiation.

A further object of the invention is to provide a photodetector structure which allows the detector to be operated at higher temperatures than has heretofore been practical with comparable materials.

Another object of the invention is to provide a photodetector structure exhibiting low noise.

A still further object of the invention is to provide a photodetector structure which dissipates less power than prior art photoconductors using comparable materials.

Yet another object of the invention is to provide a photodetector structure employing a thin layer of a superlattice material as the active, optically absorptive material.

A further object of the invention is to provide a photodetector structure providing various combinations of the foregoing features and characteristics.

SUMMARY OF THE INVENTION

According to the invention, a photodetector is formed with an integral optical cavity which is resonant at the wavelength of the optical signals to be detected. The cavity can be formed by depositing on the surface of a metallic reflector a succession of layers of appropriate materials, or by other fabrication techniques discussed herein. The total optical thickness of those layers is an odd integer multiple of one-quarter of the wavelength to be detected. Due to the resonance condition which results, optical standing waves are produced in the cavity. One of the layers of material comprising the cavity is a thin (i.e., fraction of a wavelength thick) layer of a semiconductor or other material which is optically-absorptive at the desired wavelength; this layer is placed in the cavity at a height where the optical field is at a peak. The other layers are optically transparent and have various electrical properties dependent on their intended functions.

The use of the resonant cavity and the location of the absorbing therein at a region of peak field enhance absorption substantially (present indications suggest an improvement by about an order of magnitude), as a result of which high-quantum-efficiency detectors appear possible made with an active medium thickness of about one-tenth the absorption length. Sensitivity and detectivity are also enhanced, and less power is dissipated in the absorbing material since there is much less bulk.

The photodetector may be used as a photoconductor or as a photodiode, and (depending on the embodiment selected) photocurrent may flow either parallel or transversely to the direction of applied irradiation.

By contrast, one published report depicts a Schottky barrier diode containing a metal (silicide) film as the absorbing element, mounted over an aluminum reflector. W. F. Kosonocky and H. Elabd, "Schottky-Barrier Infrared Charge-Coupled Device Focal Plane Arrays," *Proceedings of SPIE*, Vol. 443 at 167, San Diego, Aug. 1983. Not only does the structure shown in that reference differ from the present invention by virtue of the fact that it requires a metal absorbing layer, but also it fails to even suggest the benefits of a resonant cavity and only uses the aluminum as a simple reflector.

The literature also contains a description of a light-to-electricity conversion system in which a metal film was placed one-quarter wavelength from a reflector, in a configuration which apparently was intended to be resonant. This, however, was a photocathode structure which requires an associated photomultiplier to be useful. A photocathode operates on entirely different principles; it employs an alkali metal cathode designed to emit electrons from its surface into the input stage of a photomultiplier, in response to irradiation by energy at optical wavelengths. The electron-emissive material of a photocathode may not be covered with other materials (except a material to facilitate surface emission of electrons, such as about a monolayer of Cesium and Oxygen) or the emitted electrons will be immediately reabsorbed.

The term "photodetector," as used herein, is thus intended to refer to photodiodes and photoconductors, and does not include structures such as photocathodes, which operate on entirely different principles.

The invention is pointed out with particularity in the appended claims. The above and further objects, features and advantages of the invention may be better understood by referring to the following detailed description, which should be read in conjunction with the accompanying drawing.

BRIEF DESCRIPTION OF THE DRAWING

In the drawing,

FIG. 4 is a table of exemplary materials usable for detectors constructed according to the embodiments of FIGS. 1 and 2, for both photoconductor and photodiode applications.

DETAILED DESCRIPTION OF ILLUSTRATIVE EMBODIMENTS

Figure 1:
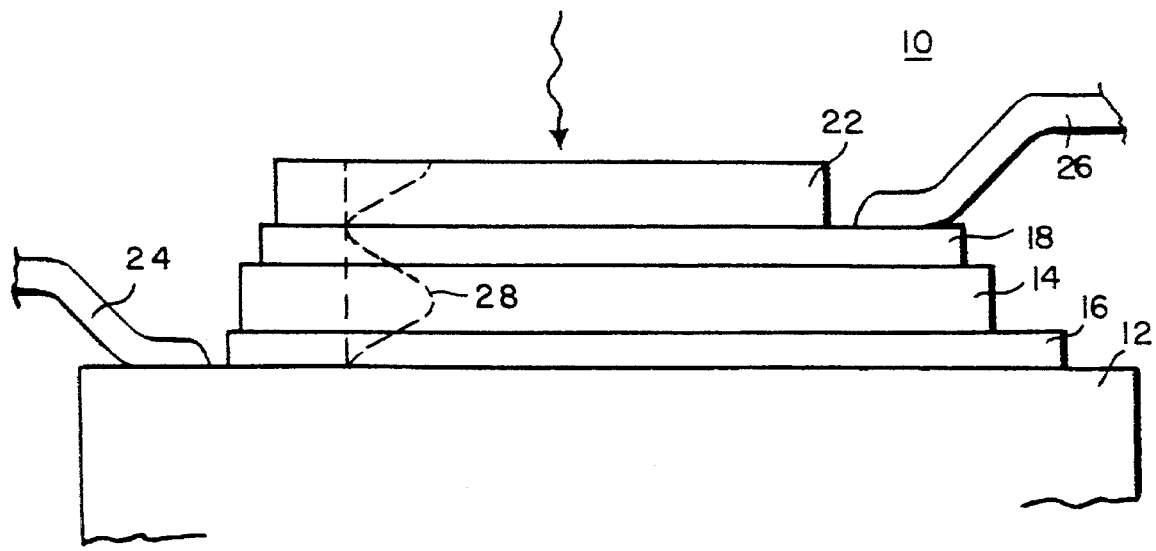
FIG. 1 is a diagrammatic illustration of a cross-section of a first embodiment of a detector structure according to the present invention, wherein the direction of the internal electrical field is substantially parallel to the direction of the incident radiation (assuming the detector to be oriented so that the latter direction is normal to the open end of the cavity)

Directing attention to FIG. 1, an embodiment of the invention is shown wherein the direction of photocurrent is parallel to the direction of the incident radiation. The detector 10 comprises a metallic reflector 12, an active layer 14 of an infrared-absorptive material (here illustrated as a semiconductor, though it could be another type of material, of course), a first contacting and conducting layer 16 between the metallic reflector and a first face of the active semiconductor layer, a second contacting and conducting layer 18 in contact with a second face of the active layer opposite the first face thereof, and a dielectric spacer layer 22 between the second contacting layer 18 and the external medium.

Each of layers 14, 16, 18 and 22 is of finite thickness, such thicknesses being designated T14, T16, T18 and T22, respectively. Further, each of those layers is characterized by an index of refraction, respectively designated n14, n16, n18, and n22. The index of refraction of layer 22, n22, should be relatively high, to provide a large discontinuity at the air interface and thereby enhance internal reflection in the cavity. The structure is made resonant by constructing it with a total optical thickness (TOT) approximately equal to an odd multiple of a quarter wavelength; that is:

$$TOT = (n14)(T14) + (n16)(T16) + (n18)(T18) + (n22)(T22)$$
$$= \frac{m(WL)}{4},$$

where WL is the optical wavelength in a vacuum and m is an odd integer. This relationship becomes an equality when the metallic reflector 12 is a perfect metal and the indices of refraction of the four layers are equal. However, when the reflector 12 is made of a real metal (which has a finite conductivity) and the indices of refraction of layers 14, 16, 18 and 22 are not equal, the resonant frequency is slightly different from that given by the equation.

A first electrode 24 is connected to the metal reflector 12 and a second electrode 26 is connected to second contacting layer 18.

The relative amplitude of the optical field within the structure is schematically illustrated by the dashed line 28 in FIG. 1 (ignoring the effects which would be caused by differences in the indices of refraction of the various layers). The optical field is at a minimum near the interface between reflector 12 and first contacting layer 16, as well as near the boundary between second contacting layer 18 and dielectric layer 22. Regions of peak optical field intensity are located near the air interface (i.e., the surface of layer 22 on which the incident radiation falls) and at distances approximately equal to odd multiples of one-quarter wavelength from the surface of reflector 12.

Preferably, a highly conducting contact layer 16 is employed between the active material 14 and the metal reflector 12. Such a layer is best made from a material which is highly transparent optically and should be located in a region of low optical intensity, so that optical power is not absorbed wastefully. Fortunately, the region adjacent the reflector surface is such a region. Moreover, to achieve maximum absorption per unit thickness of the active semiconductor material, it is preferable that no active material be located in about the first one-eighth wavelength from the metal reflector, where the optical field is weak. This can easily be accomplished by judiciously choosing the thickness of the first conducting layer.

The thickness of the second contacting layer 18 is approximately comparable to that of the first contacting layer 16, since it is determined by the same desire to achieve maximum absorption per unit thickness of the active layer; this constrains the active layer to the region of peak optical field and to an optical thickness of approximately one-quarter wavelength (i.e., a physical thickness of about WL/4n, where n is the refractive index of the active medium). The thickness of layer 22 may be controlled to satisfy the resonance condition specified above.

By thus peaking the optical field and placing the active medium in the peaked field, the absorption coefficient is enhanced by a factor of 4n over that of a nonresonant structure. This enhancement factor can be substantial for the semiconductor materials commonly used in optical infrared detectors. For example, the common detector materials GaAs, Ge, $In_{1-x}Ga_xAs_{1-y}P_y$, InSb, $Hg_{1-x}Cd_xTe$, PbS, $Pb_{1-x}Sn_xTe$, and Si have refractive indices of approximately 3.4, 4.0, 5.5, 4.0, 3.6, 4.2, 6 and 3.4, respectively. Thus for these materials, an enhancement of from about 13.6 to 24 can be obtained.

This structure is readily applicable over a wide spectrum, from wavelengths less than 0.8 microns to wavelengths over 200 microns using materials such as those set forth above. In most practical photodetectors, the integer m will be small, probably less than seven. A detector with a one-quarter wave cavity will have a relatively large spectral bandwidth, since strong enhancement of absorption occurs at all wavelengths within about twenty percent of the peak resonant wavelength. For a three-quarter wave cavity, the spectral bandwidth generally will be much smaller.

When the photodetector structure 10 is employed in a photoconductor, an external source of bias is required. No such bias is required, however, when the same structure is used as a photodiode, as photovoltaic current can flow due to the internal electrical field of the diode.

Certain variations on the theme of FIG. 1 may readily be envisioned, without departing from its spirit. For example, layer 22 may be omitted entirely if layer 18 is thickened a corresponding amount. Of course, if electrode 26 is still connected to layer 18, the electrical fields will change accordingly, so the device's characteristics will be altered. It may also be possible to dispense with layer 16 and to have absorbing semiconductor layer 14 deposited directly on metal reflector 12, provided the additional thickness in layer 14 is acceptable and further provided a good contact can be established between the metal reflector and the absorbing semiconductor material. Alternatively, layer 16 could be made a dielectric layer, in which event the electrode 24 could be connected directly to layer 14. Or a dielectric layer could be deposited on the reflector first, before first conducting layer 16 is formed, in which case the electrode 24 would be connected directly to layer 16; this would allow several detectors to be formed on the same metallic reflector.

Figure 2:
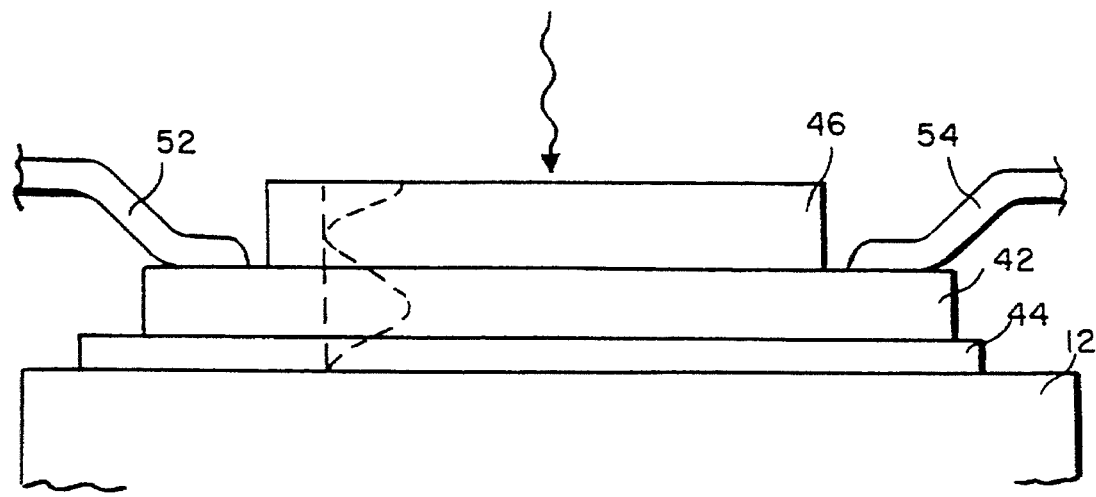
FIG. 2 is a diagrammatic illustration of a cross-section of a second embodiment of a detector structure according to the present invention, wherein the direction of th internal electrical field is substantially perpendicular to the direction of the incident radiation.

A second embodiment of the invention is illustrated in FIG. 2, wherein the principal difference is that the photocurrent flows transversely to the direction of the incident radiation (assuming the detector is oriented so that the direction of irradiation is normal to the receiving surface of the detector. In this embodiment, a three layer semiconductor structure is mounted on a metal reflector 12. The three layer structure comprises a layer of active semiconductor material 42 sandwiched between a pair of optically transparent dielectric layers 44 and 46. The first dielectric layer 44 separates the active layer 42 from the reflector 12 and prevents the metallic reflector from providing a shorting path between electrodes 52 and 54, which are attached to opposite sides (or ends) of the active layer 42. The second dielectric layer 46 provides a transition between the active layer and the external environment (e.g., air).

This structure is also constructed so that its total optical thickness (TOT) is an odd multiple of one-quarter wavelength; that is:

$$TOT = (n42)(T42) + (n44)(T44) + (n46)(T46)$$
$$= \frac{m(WL)}{4},$$

where nXY represents the index of refraction of layer XY, TXY represents the thickness of that layer and m is an odd integer. Layers 42 and 44 are approximately the same thickness as layers 14 and 16, respectively, of FIG. 1, as their thicknesses are dictated by the same considerations. Layer 46, however, has no electrical function; its sole purpose is to establish the required cavity length to provide a resonance. Therefore its thickness is approximately the same as the thicknesses of layers 18 and 22 combined.

Optionally, a thin layer (e.g., about 100 Angstroms) of a material such as an oxide of the absorbing semiconductor material in layer 42 may be employed (e.g., deposited between layers 42 and 46 to improve electrical passivation.

And layer 46 may be combined with layer 42. This may not be quite so efficient, since the absorbing material will not be confined to regions of peak field, but it will allow more of the optical field to interact with the absorbing material.

Figure 3:
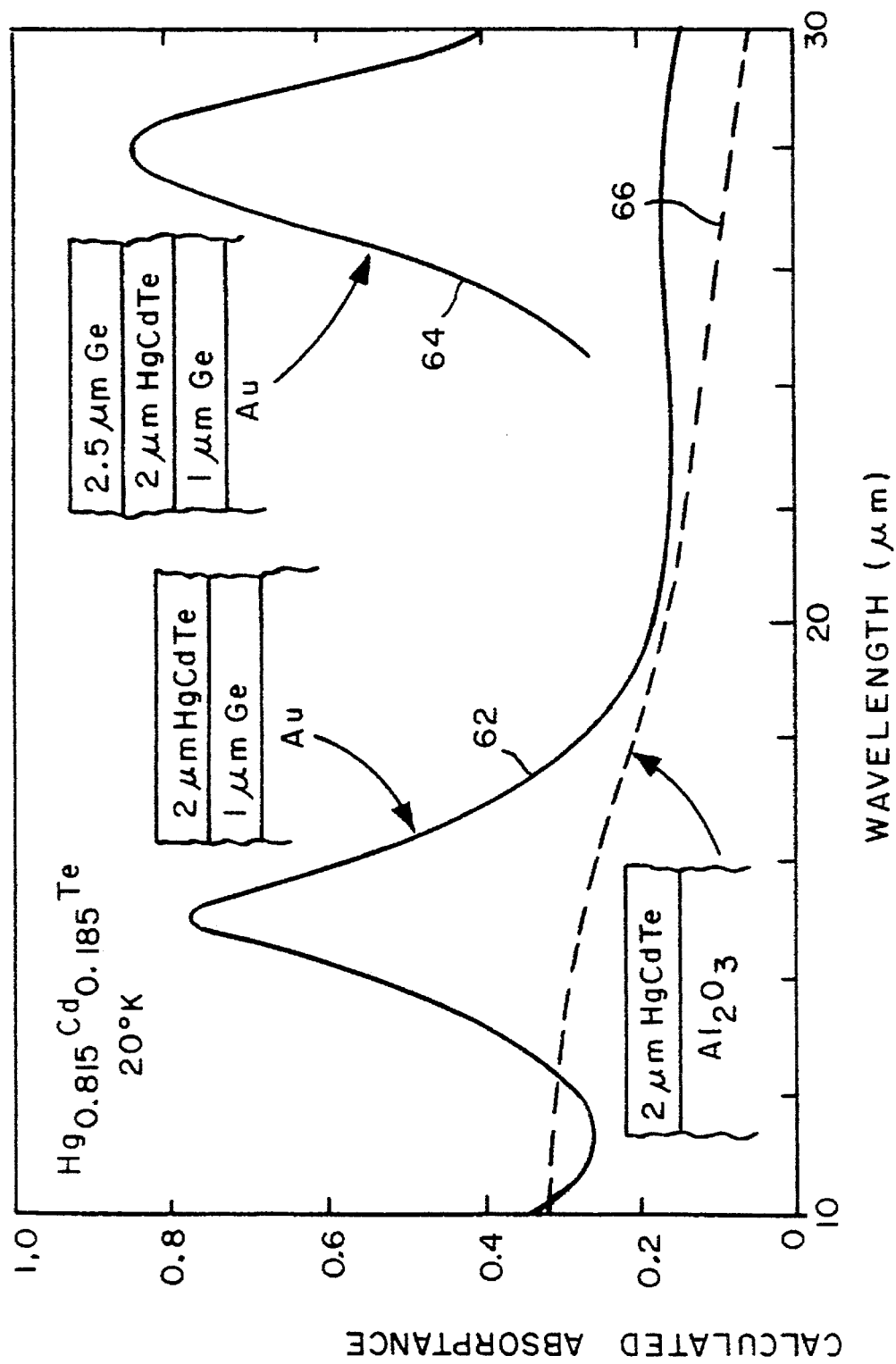
FIG. 3 is a graph of calculated absorptance of a detector constructed according to the embodiment of FIG. 2 using materials as indicated on the Figure, with comparison graphs for a cavity-less detector using the same materials.

The calculated absorptance of one detector constructed in accordance with the invention is shown in FIG. 3. There it is assumed that m=3, WL=28 microns, the active medium is Hg.815Cd.185Te, T42=2 microns, the dielectric spacer layer is Germanium, T44=1 microns, the reflector layer 12 is gold, and the temperature is 20 degrees K. The solid line 62 represents the absorptance without a dielectric layer 46, while the solid line 64 represents the absorptance which results when a 2.5 microns thickness of Germanium is added for layer 46, thereby forming the resonant cavity. Note that over 80% absorption is calculated for an active layer thickness of only 2 microns, which is more than a ten-fold improvement over a nonresonant detector having an active layer of the same material and thickness (represented by dashed curve 66).

This design should yield a comparable reduction in operating power requirements for a detector, as well. Further, when such a detector is employed in a direct detection system, there should be a similar ten-fold reduction in bias power needs. And when such a detector is used in a heterodyne detection system, there should likewise be a ten-fold reduction in bias and optical local oscillator power requirements. Further, the detector should be able to operate at temperatures up to about twenty percent higher (on the Kelvin scale) than other detectors using the same materials in a conventional structure, without adversely affecting noise and sensitivity.

When the absorbing material is a semiconductor, the various layers (14–22 in FIG. 1 and 42–46 in FIG. 2) may be formed by successively depositing material of appropriate thickness on the metallic reflector 12 (and the previously deposited layers) in that succession. Alternatively, a crystalline semiconductor may be used as the active, absorbing material. In that case, the metallic reflector layer may be formed thereon by deposition on one surface of the crystal, the opposing surface of the crystal may be polished down to the desired thickness, and the remaining layer or layers of material may then be deposited on such opposing surface. When the absorbing material is a metal film such as a PtSi or other silicide, other fabrication sequences may be required; the appropriate fabrication steps will be readily apparent to those skilled in the art.

As an example only, the compositions of the various layers may be as specified in the table given as FIG. 4, where compositions are shown for using the structures of FIGS. 1 and 2 as both photoconductors and photodiodes. Of course, different materials may be employed and the parameters may be varied by those skilled in the art in order to achieve devices with the specific performance characteristics the user desires. In the example relating to the use of the FIG. 2 structure as a photodiode, it should be understood that layer 42 would be split in two, so as to form a p-n junction in the vertical plane, with one electrode connected to the p side and one electrode connected to the n side; this is referred to as a lateral photodiode.

Though the invention has been illustrated with only uniform semiconductor materials for each layer, it is not so limited. In addition to the use of metal films for the absorbing layer, the invention is thought to be particularly useful when the active, absorbing layer is made from a very thin superlattice comprising two different semiconductors of different energy gaps. Such superlattices are difficult to produce in layers approaching or exceeding one wavelength in thickness, whereas far less difficulty should be encountered in producing superlattice layers only one-tenth as thick as the prior art requires.

Having thus described two exemplary embodiments of the invention and several variations thereof, it will be apparent that various other alterations, modifications and improvements will readily occur to those skilled in the art. For example, a wide variety of semiconductor materials may be employed in addition to those discussed herein. As discussed above, layers may be added to the exemplary structures (including passivation layers to protect the semiconductor materials) and some layers may be combined. Parameters such as dimensions and materials may be selected to adapt the structure to detecting various types of optical signals; the infrared application has simply been used as an example, due to the current interest in infrared detection. Such obvious alterations, modifications and improvements, though not expressly described above, are nevertheless intended to be implied and are within the spirit and scope of the invention. Accordingly, the foregoing discussion is intended to be illustrative only, and not limiting; the invention is limited and defined only by the following claims and equivalents thereto.

What is claimed is:

1. A photodetector for detecting optical radiation in a band centered about a predetermined wavelength, comprising:

a. an optical cavity having a metallic reflector at a first end thereof and being open to receive optical radiation at a second, opposite end thereof, the total optical distance between the first and second ends of the cavity being an odd multiple of one-quarter of said predetermined wavelength, such that when the first end of the cavity is optically irradiated with energy within said band by a source outside the cavity, optical standing waves are produced in the cavity with the optical field intensity of such standing waves varying with distance from the reflector and having at least one peak of intensity within the cavity;

b. a layer of semiconductor material, termed the "active layer", which is optically absorptive at said predetermined wavelength and which is disposed within the cavity at a location including a region of peak optical intensity; and c. first and second electrodes electrically coupled to the active layer for connecting the detector to apparatus for sensing changes in the detector resulting from the incidence on the open end of the cavity of radiation in said band.

2. The photodetector of claim 1 wherein the thickness of the active layer is approximately equal to the predetermined wavelength divided by four times the index of refraction of the semiconductor material of which it is composed.

3. The photodetector of claim 2 further including d. an optically transparent, relatively highly conductive semiconductor layer disposed between and contacting on one side the metallic reflector and on another side the active layer.

4. The photodetector of claim 2 further including e. a first, optically transparent, relatively highly conductive semiconductor layer, termed the first contacting layer, disposed between and contacting on one side the metallic reflector and on another side the active layer; and f. a second, optically transparent, relatively highly conductive semiconductor layer, termed the second contacting layer, disposed between the open end of the cavity and the active layer and contacting the active layer.

5. The photodetector of claim 4 wherein the first electrode is operatively connected to the first contacting layer and the second electrode is operatively connected to the second contacting layer.

6. The photodetector of claim 2 further including g. a first layer of optically transparent dielectric material disposed between and contacting on one side the metallic reflector and on another side the active layer.

7. The photodetector of claim 6 wherein the first and second electrodes are operatively connected to opposite sides of the active layer.

8. The photodetector of claim 7 further including h. an optically transparent, electrically dielectric layer disposed on the active layer, between the active layer and the open end of the cavity.

9. The photodetector of claim 1 wherein the thickness of the active layer is substantially less than its absorption length.

10. The photodetector of claim 9 wherein the thickness of the active layer is approximately equal to the predetermined wavelength divided by four times the index of refraction of the active semiconductor material.

* * * * *